(12) United States Patent
Rambaud et al.

(10) Patent No.: US 8,207,780 B2
(45) Date of Patent: Jun. 26, 2012

(54) ELECTRONIC CONTROL MODULE FOR A JFET TRANSISTOR

(75) Inventors: Julien Rambaud, Echarcon (FR); Sébastien Vieillard, La Chapelle-Gauthier (FR)

(73) Assignee: Hispano Suiza, Colombes (FR)

( * ) Notice: Subject to any disclaimer, the term of this patent is extended or adjusted under 35 U.S.C. 154(b) by 30 days.

(21) Appl. No.: 12/871,661

(22) Filed: Aug. 30, 2010

(65) Prior Publication Data

US 2011/0121891 A1     May 26, 2011

(30) Foreign Application Priority Data

Aug. 31, 2009    (FR) ...................................... 09 55933

(51) Int. Cl.
     *H03K 17/687*       (2006.01)
(52) U.S. Cl. ........................................ 327/430; 327/108
(58) Field of Classification Search .................. 327/108, 327/109, 110, 111, 427, 430
See application file for complete search history.

(56) References Cited

U.S. PATENT DOCUMENTS

| 5,254,975 | A | * | 10/1993 | Torikoshi | 340/589 |
| 5,282,107 | A | * | 1/1994 | Balakrishnan | 361/18 |
| 6,373,318 | B1 | * | 4/2002 | Dohnke et al. | 327/427 |
| 6,605,978 | B1 | * | 8/2003 | Halamik et al. | 327/430 |
| 6,633,195 | B2 | * | 10/2003 | Baudelot et al. | 327/430 |
| 6,943,611 | B2 | * | 9/2005 | Braun et al. | 327/430 |
| 7,768,758 | B2 | * | 8/2010 | Maier et al. | 361/93.1 |

* cited by examiner

*Primary Examiner* — Jeffrey Zweizig
(74) *Attorney, Agent, or Firm* — Pillsbury Winthrop Shaw Pittman, LLP

(57) ABSTRACT

An electronic control module for a field effect transistor includes a gate, a drain and a source. The electronic control module includes: a control circuit including: a power supply able to provide a fixed potential to the gate of the field effect transistor; and an amplifier stage able to vary the potential of the source of the field effect transistor with relation to the potential of the gate of the field effect transistor; and a field effect transistor whose gate is connected to the fixed potential; and source is connected to the amplifier stage.

9 Claims, 6 Drawing Sheets

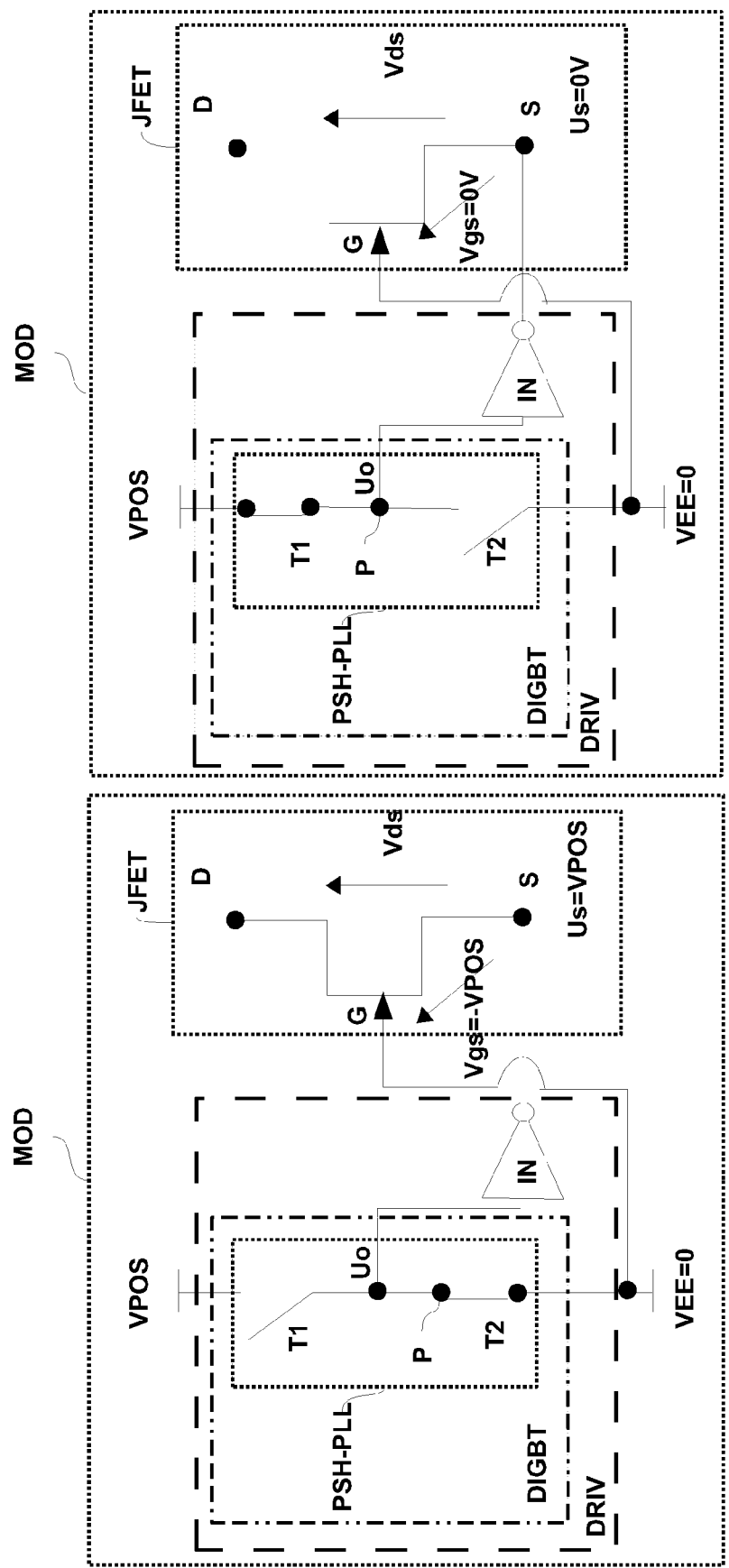

US 8,207,780 B2

ELECTRONIC CONTROL MODULE FOR A JFET TRANSISTOR

CROSS-REFERENCE TO RELATED APPLICATIONS

This application is based upon and claims the benefit of priority from French patent application Ser. No. 09/55933, filed Aug. 31, 2009, the entire content of which is incorporated herein by reference.

TECHNICAL FIELD OF THE INVENTION

The present invention relates to an electronic control module for a field effect transistor comprising a gate, a drain and a source.

The invention finds a special application in the field of field effect transistors.

TECHNOLOGICAL BACKGROUND OF THE INVENTION

In the field effect transistor field, a known electronic control module prior art comprises a field effect transistor and a control circuit for controlling the field effect transistor by varying the gate potential of the transistor with relation to the potential of its source. The control circuit is powered with a negative voltage since a field effect transistor is controlled in negative voltage.

When the field effect transistor is in the on state, there is a risk of short circuit, which may lead to its destruction.

Methods exist that allow a short circuit to be detected, especially by comparing the drain to source voltage, known as the saturation voltage, of the transistor with a reference voltage, said drain to source voltage being positive.

When the drain to source voltage is greater than this reference voltage, it is deduced therefrom that the field effect transistor is in an overcurrent or short circuit state.

A negative potential is thus necessary to control the field effect because of the negative voltage control and a positive potential is also necessary for comparison with the positive saturation voltage.

One drawback of this prior art is that one must thus have an additional electrically insulated power supply for detecting the short circuit, which leads to additional power supply regulation problems. This adds an additional component, the additional power supply, to the control module in the case where short circuit detection is performed outside the control circuit, and otherwise, this complicates the design of the control circuit itself for incorporate the additional power supply in the case where short circuit detection is performed inside the control circuit.

GENERAL DESCRIPTION OF THE INVENTION

The object of the present invention is an electronic control module for a field effect transistor comprising a gate, a drain and a source that avoids having an additional power supply for detecting a short circuit in said field effect transistor.

This object is reached by an electronic control module for a field effect transistor comprising a gate, a drain and a source, characterized in that the module comprises:

A control circuit comprising:
  A power supply able to provide a fixed potential to the gate of the field effect transistor; and
  An amplifier stage able to vary the potential of the source of the field effect transistor with relation to the potential of the gate of said field effect transistor; and
A field effect transistor whose:
  Gate is connected to said fixed potential; and
  Source is connected to said amplifier stage.

As will be seen in detail subsequently, by controlling the field effect transistor with its source instead of its gate, it will enable the drain to source voltage of the field effect transistor to be referenced to the fixed voltage when the transistor is in an on state, that is, when it is in a state where there is a short circuit risk. The drain to source voltage thus comprises the same reference as the short circuit detection function. This drain to source voltage may thus be easily compared without having an additional power supply.

According to not limited embodiments; the electronic control module may also comprise one or more additional characteristics, including the following:

The fixed potential is the lowest potential provided by the power supply.

The amplifier stage is able to position the potential of the source to the fixed potential to switch on said field effect transistor.

The amplifier stage comprises at least two transistors placed in series in a push-pull type assembly, one of the transistors of said amplifier stage comprising a collector that is able to be connected with the gate of said field effect transistor. This allows an amplifier stage that is commonly utilized to be used.

The fixed potential is a negative potential and the control circuit further comprises a voltage comparator referenced with said fixed potential and able to compare the drain to source voltage of said field effect transistor with a reference voltage. This enables the control circuit to be supplied with a negative power supply.

The control circuit comprises an insulated gate bipolar transistor control device and a voltage inverter coupled to said control device, said voltage inverter being connected in input to a common junction point of the amplifier stage and in output to the source of said field effect transistor. Thus, this enables a control device supplied with positive voltage that is commonly utilized in the transistor field to be used.

The control circuit further comprises a voltage level shift device. Thus, this enables a control device supplied between a negative potential and a positive potential commonly utilized in the transistor field to be used.

In addition, an electromechanical actuator is also proposed, characterized in that the actuator comprises an electronic control module according to any one of the previous characteristics.

In addition, an electric thrust reverser is also proposed, characterized in that the reverser comprises an electronic control module according to any one of the previous characteristics.

The invention and its different applications will be better understood upon reading the following description and examining the accompanying figures.

BRIEF DESCRIPTION OF THE FIGURES

The figures are presented for indicative purposes only and in no way limit the invention.

FIG. 6 and FIG. 7 are simplified diagrams according to a second not limited embodiment of the electronic control module of FIG. 1 in first and second modes of operation respectively, the control circuit of said electronic control module being supplied with positive voltage;

DESCRIPTION OF EMBODIMENTS OF THE INVENTION

Figure 1:
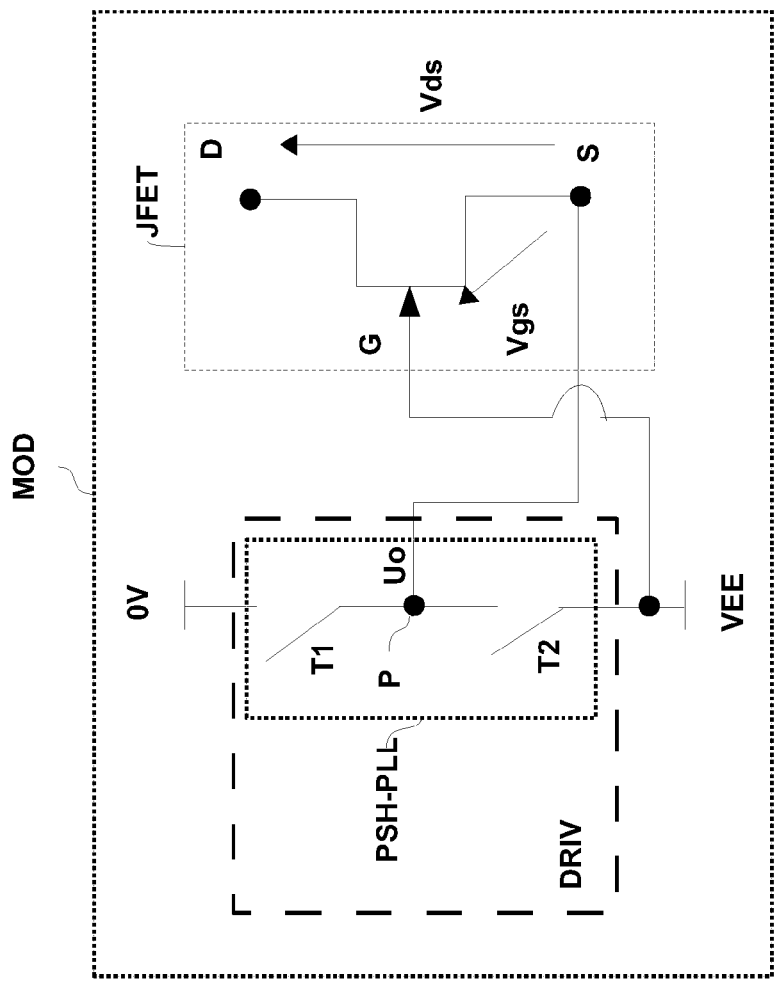
FIG. 1 is a simplified diagram of an electronic control module according to the invention comprising a control circuit and a field effect transistor.

The electronic control module MOD for a field effect transistor JFET comprising a gate G, a drain D and a source S is schematically illustrated in FIG. 1.

It will be noted that in the following description, the field effect transistor JFET will be indifferently called a JFET transistor or a JFET.

The electronic control module MOD comprises:
A control circuit DRIV comprising:
   A power supply able to provide a fixed potential VEE to the gate G of the field effect transistor JFET; and
   An amplifier stage PSH-PLL able to vary the potential of the source S of the field effect transistor JFET with relation to the potential of the gate G of said field effect transistor JFET; and
A field effect transistor JFET whose:
   Gate G is connected to said fixed potential VEE; and
   Source S is connected to said amplifier stage PSH-PLL.

The control circuit DRIV thus enables the gate G of the JFET transistor to be set to the fixed potential VEE while it varies the potential of the source of the JFET transistor.

It will be noted that fixed potential VEE is understood to refer to a potential that does not vary especially during the use of the field effect transistor JFET, i.e., a potential that is frozen.

Figure 2:
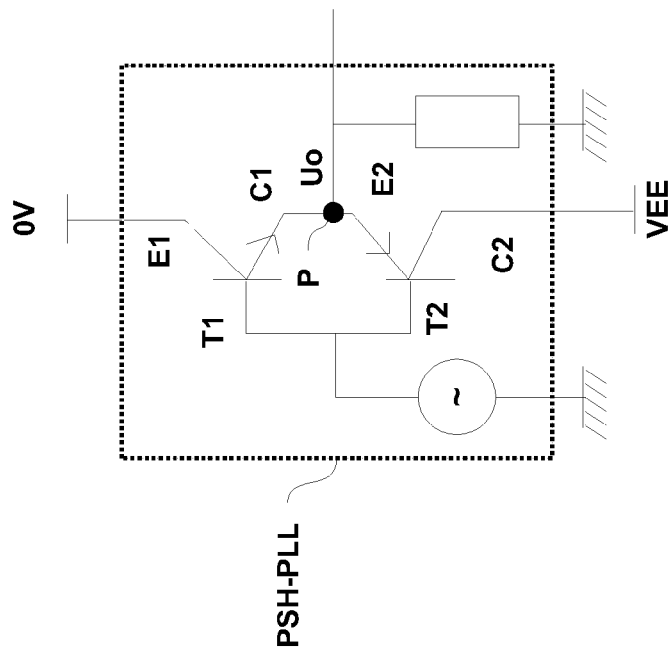
FIG. 2 is a simplified diagram of a not limited embodiment of an amplifier stage of the control circuit of FIG. 1.

In a not limited embodiment illustrated in a simplified manner in FIG. 2, the amplifier stage PHS-PLL of the control circuit DRIV comprises at least two switches placed in series T1-T2 comprising a common junction point P able to be coupled to the source S of said field effect transistor JFET, one of the switches T2 of said amplifier stage being able to be coupled to the gate G of said field effect transistor JFET.

In one not limited variant of embodiment, the first switch T1 and the second switch T2 are transistors. Thus, the amplifier stage PHS-PLL comprises at least two transistors placed in series T1-T2 comprising one common anode-cathode junction point P that is able to be coupled to the source S of said field effect transistor JFET, one of the transistors T2 of said amplifier stage comprising an electrode C2 that is able to be coupled to the gate G of said JFET field effect transistor.

In a not limited example, the first transistor T1 is an NPN type IGBT bipolar transistor and the second transistor T2 is a PNP type IGBT bipolar transistor. In this case, the anode of the junction point P is the collector C1 of the first transistor T1 and the cathode of the junction point P is the emitter E2 of the second transistor T2. In addition, the electrode C2 that is able to be coupled to the gate G of the JFET is the collector of the second bipolar transistor T2.

In this variant of embodiment, the amplifier stage PSH-PLL is a stage known as "Push-Pull." As a push-pull stage is well known to the person skilled in the art, it is not described in further detail.

In a not limited embodiment, the fixed potential VEE is the lowest potential provided by the power supply of the driver DRIV.

In a first not limited embodiment of the electronic control module MOD, the fixed potential VEE is a negative potential VNEG and the control circuit DRIV further comprises a voltage comparator CMP referenced with said fixed potential VEE and able to compare the drain to source voltage Vds of said field effect transistor JFET with a reference voltage.

In a second not limited embodiment of the electronic control module MOD, the control circuit DRIV further comprises a control device DIGBT of an insulated gate bipolar transistor IGBT and a voltage inverter IN coupled to said control device DIGBT.

In a third not limited embodiment of the electronic control module MOD, the control circuit DRIV further comprises a control device DIGBT of an insulated gate bipolar transistor IGBT, a voltage inverter IN coupled to said control device DIGBT and a voltage level shift device DEN.

Figure 3:
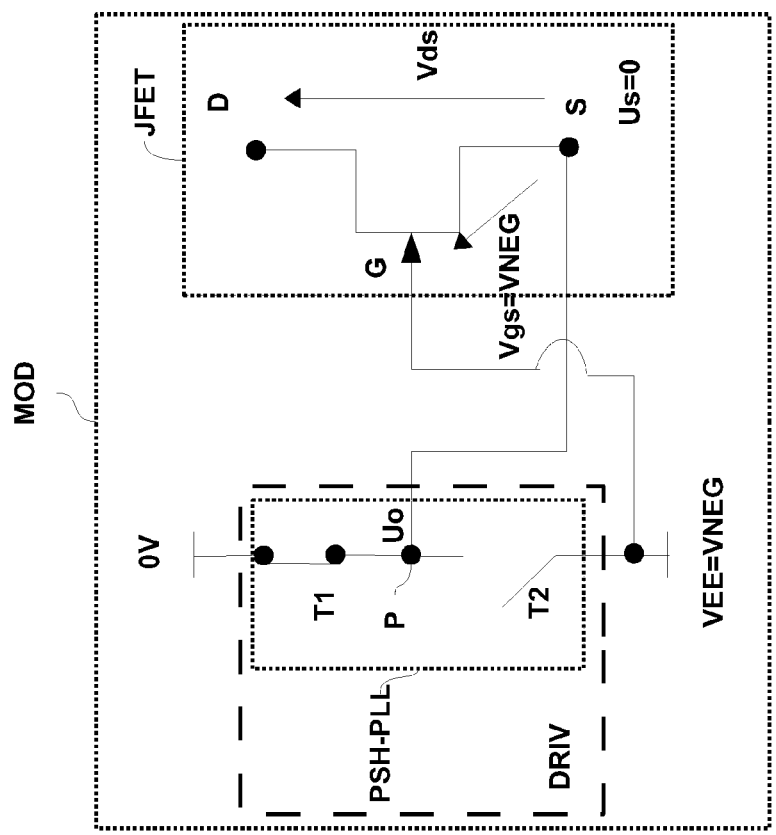
FIG. 3 and FIG. 4 are simplified diagrams according to a first not limited embodiment of the electronic control module of FIG. 1 in first and second modes of operation respectively, the control circuit of said electronic control module being supplied with negative voltage.
Figure 4:
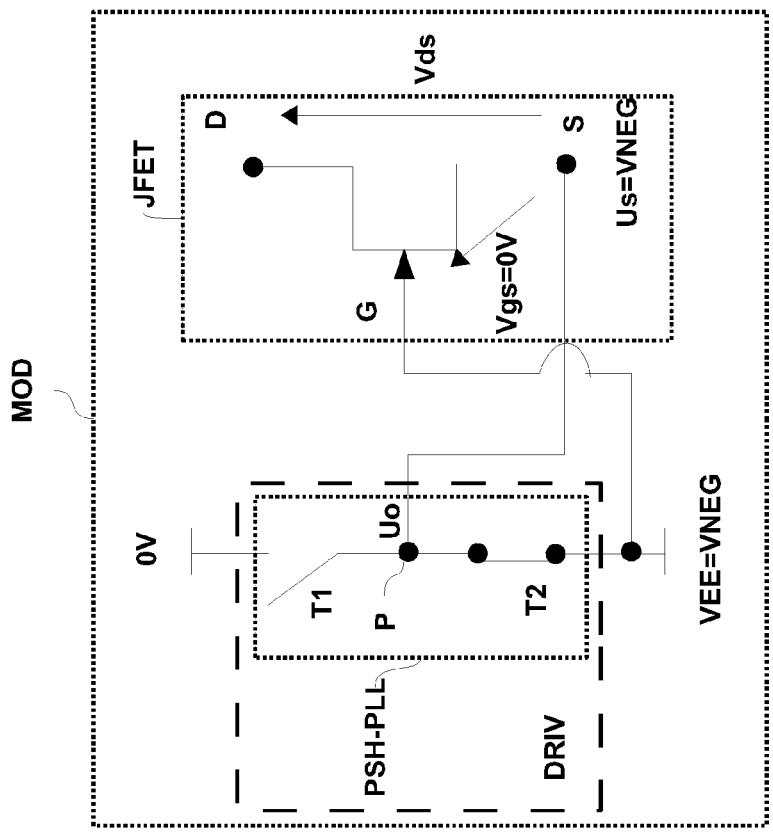
Figure 9:
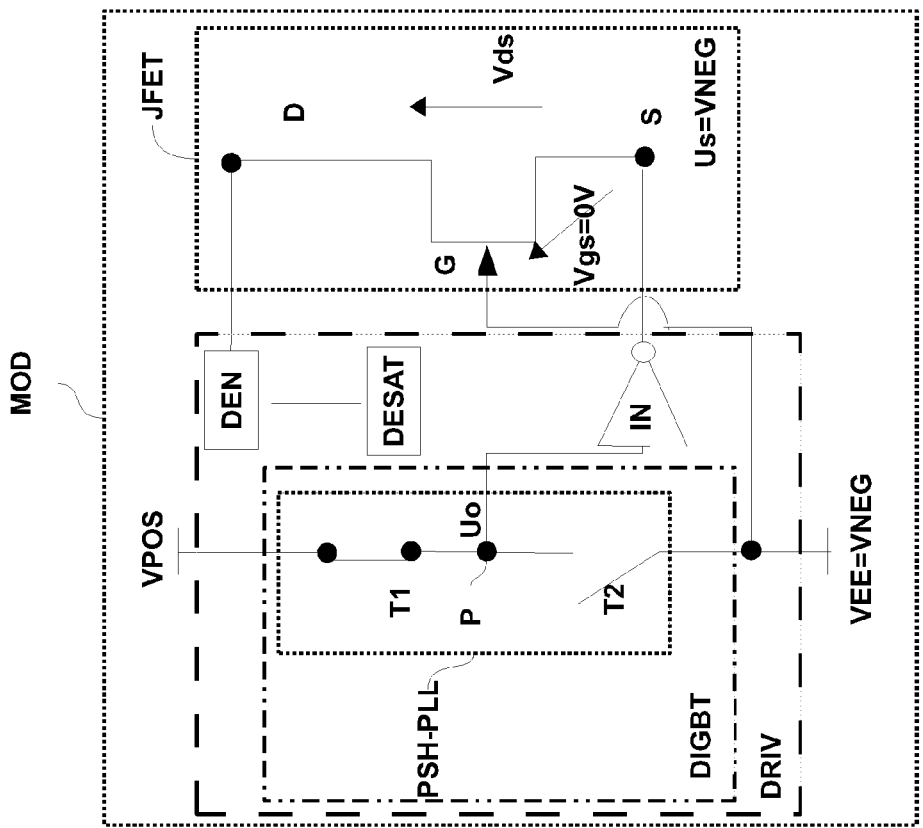
FIG. 8 and FIG. 9 are simplified diagrams according to a third not limited embodiment of the electronic control module of FIG. 1 in first and second modes of operation respectively, the control circuit of said electronic control module being supplied between a positive potential and a negative potential.
Figure 8:
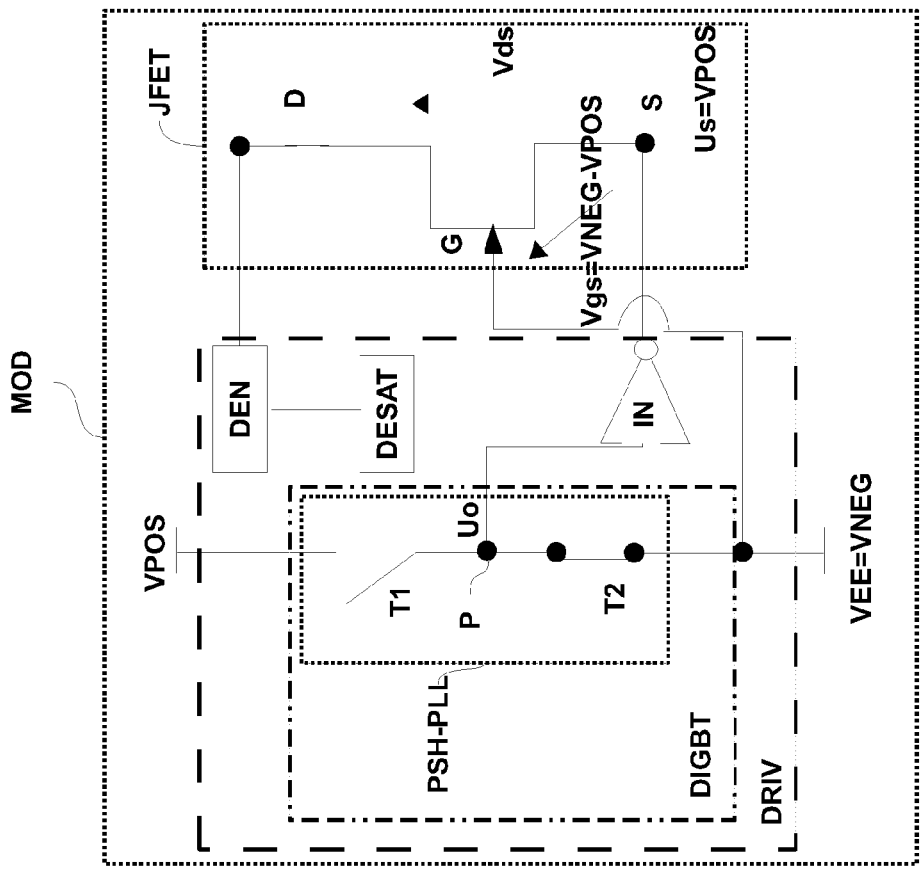

The operation of the electronic control module MOD according to these three embodiments above-mentioned is respectively illustrated in three examples, which are as follows:
   when the control circuit DRIV is supplied with a negative voltage (FIGS. 3 and 4);
   When the control circuit DRIV is supplied with a positive voltage (FIGS. 6 and 7).
   When the control circuit DRIV is supplied between a negative potential and a positive potential (FIGS. 8 and 9).

It will be noted that in a not limited manner, in these three embodiments, the potential Us of the source S may be varied between the lowest potential and the highest potential provided by the power supply of the control circuit DRIV.

First Embodiment

Negative Voltage Power Supply

As illustrated in FIG. 3 and FIG. 4, the control circuit DRIV comprises a power supply that provides a negative voltage VNEG-0V. In a not limited example, the fixed potential VEE provided by the power supply of control circuit DRIV to the gate G of the JFET transistor is positioned at the lowest potential, that is to say the potential VNEG provided by the power supply. Thus, the negative potential supplies the gate of the JFET transistor, that is to say Ug=VNEG.

In this first embodiment, the amplifier stage PHS-PLL is able to:
Position the potential of the source S to zero to switch off the field effect transistor JFET; and
Position the potential of the source S to the fixed potential VEE to switch on said field effect transistor JFET.

According to a first mode of operation such as illustrated in FIG. 3, when the first switch T1 is open, and the second switch T2 is closed, one has the junction potential Uo at the junction point P that is raised to the negative potential VNEG. Thus one obtains:
Us=VNEG;
Vsg=Us−Ug=0; and
Vds=Ud−Us>0 and is thus referenced with relation to the negative potential VNEG since the potential Us of source S is raised to the negative potential VNEG.

Therefore one has the voltage Vds which is lower than VNEG in absolute value and that is therefore within the range of voltages provided by the power supply [0; VNEG].

The JFET transistor is in an on state.

In this on state, there are risks of short circuit on the JFET transistor. A short circuit may occur when the JFET transistor is on over a voltage source. In this case, the transistor alone limits the current (the latter being 5 to 10 times higher than the rated current) with the full supply voltage to its terminals. As a result, the JFET transistor dissipates a very high energy level, which may cause an abnormal rise of its temperature and therefore its destruction if this dissipation lasts too long.

Figure 5:
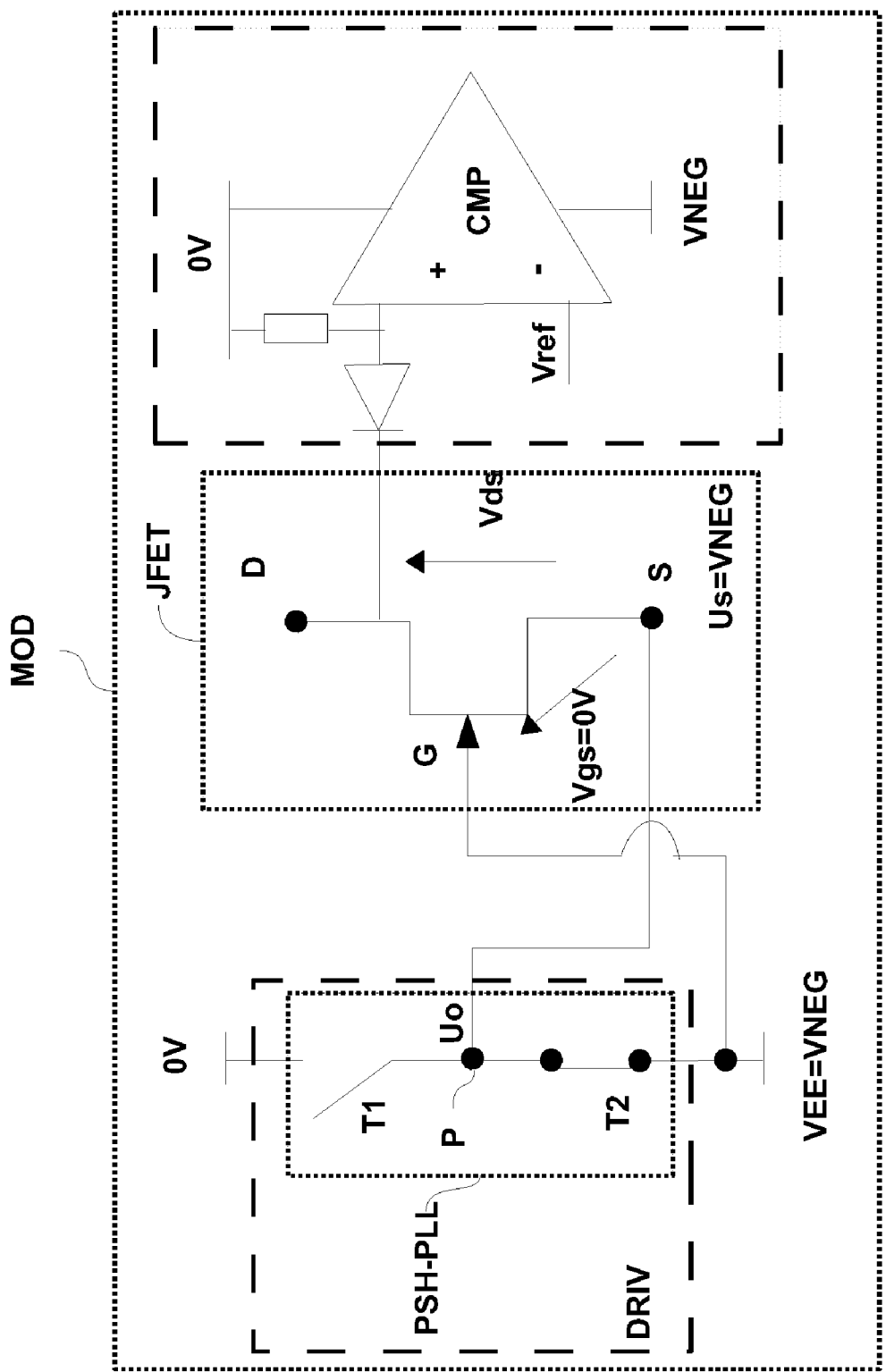
FIG. 5 is a simplified diagram of the electronic control module of FIG. 3 or FIG. 4, in which a short circuit detection function is illustrated.

In order to determine the presence of a short circuit, the control circuit DRIV further comprises, as illustrated in FIG. 5, a voltage comparator CMP referenced with said fixed potential VEE=VNEG (since it is supplied with a negative power supply voltage VNEG-0V) and able to compare the drain to source voltage Vds of said field effect transistor JFET with a reference voltage. If the Vds voltage is greater than this reference voltage, this means that the JFET transistor is in short circuit. It will be noted that a protection diode and a polarization resistance also exist between the drain of the JFET transistor and the voltage comparator CMP, as illustrated in FIG. 5. As these two elements and their functions are well known to the person skilled in the art, they are not described here.

As the drain to source voltage Vds is referenced with relation to the negative potential VNEG, which corresponds to the same reference potential as that of the comparator CMP, the comparison may be made without having an additional power supply.

According to a second mode of operation such as illustrated in FIG. 4, when the first switch T1 is closed, and the second switch T2 is open, one has the junction potential Uo at the junction point P that is raised to 0V. Thus one obtains:
Us=0;
Vsg=Us−Ug=−VNEG>0, that is to say Vgs=VNEG<0; and
Vds=Ud−Us>0. The voltage Vds thus departs from the range of voltages provided by the power supply [0-VNEG].
The JFET transistor is in a switch off state.

Second Embodiment

Positive Voltage Power Supply

In this power supply mode, in a not limited embodiment, the control circuit DRIV further comprises a control device DIGBT of an insulated gate bipolar transistor IGBT and a voltage inverter IN coupled to said control device DIGBT.

In this embodiment, the control device DIGBT also comprises the amplifier stage PSH-PLL such as described previously.

Moreover, it will be noted that the control devices DIGBT of an insulated gate bipolar transistor IGBT that are well known to the person skilled in the art are either supplied in positive voltage 0V-VPOS, or in voltage between a negative potential VNEG and a positive potential VPOS. In this example, the control device DIGBT is supplied in positive voltage 0V-VPOS.

In this second embodiment, the amplifier stage PSH-PLL is able to position the potential of the source S to the fixed potential VEE to switch on said field effect transistor JFET.

As illustrated in FIG. 6 and FIG. 7, the control circuit DRIV is supplied by a positive power supply voltage 0V-VPOS thus comprising a positive potential VPOS, the control circuit thus being placed between the ground and the positive potential VPOS. The fixed potential VEE provided by the power supply of the control circuit DRIV to the gate G of the JFET transistor is positioned at the lowest potential provided by the power supply, which is the ground. The potential Ug of the gate G is therefore grounded, that is to say Ug=0V.

It will be noted that the voltage inverter IN is also supplied by the same positive power supply voltage 0V-VPOS as the control circuit DRIV.

Moreover, one reminds that the function of the inverter IN enables the input signal to be inverted at the logical level.

According to a first mode of operation such as illustrated in FIG. 6, when the first switch T1 is open, and the second switch T2 is closed, one has the junction potential Uo at the junction point P that is drawn to ground. One thus obtains:
Uo=VEE=0V in input of the inverter IN, that is to say Us=VPOS in output of the inverter IN;
Vsg=Us−Ug=VPOS, that is to say Vgs=−VPOS<0; and
Vds=Ud−Us>0. The voltage Vds departs from the range of voltages of power supply [0-VPOS].
The JFET transistor is in a switch off state.

According to a second mode of operation such as illustrated in FIG. 7, when the first switch T1 is closed, and the second switch T2 is open, one has the junction potential Uo at the junction point P that is raised to the positive potential VPOS. One thus obtains:
Uo=VPOS in input of the inverter IN, that is to say Us=0V in output of the inverter IN;
Vsg=Us−Ug=0V; and
Vds=Ud−Us>0 and is thus referenced with relation to the ground since the potential Us of the source S is at ground.
Thus, the voltage Vds is lower than VPOS in absolute value and is thus within a range of power supply voltages [0; VPOS].
The JFET transistor is in an on state.

In this on state, there are risks of short circuit on the JFET transistor, as described in the first embodiment (with a negative power supply).

In order to determine the presence of a short circuit, the control device DIGBT comprises, in a manner known to the person skilled in the art, an internal short circuit detection function known as the saturation detection function DESAT, also commonly known as the desat function.

In one not limited example, this saturation detection function is implemented by means of an internal voltage comparator (not represented) that is thus referenced with said fixed potential VEE=0V (since the control device DIGBT is supplied between the ground and the potential VPOS) and able to compare the drain to source voltage Vds of said field effect transistor JFET with a reference voltage Vref. If the voltage Vds is greater than this voltage Vref, this means that the JFET transistor is in short circuit.

As the drain to source voltage Vds is referenced with relation to the ground that corresponds to the same reference potential as that of the internal comparator, the comparison may be made without having an additional power supply.

Third Embodiment

Power Supply Between a Negative Potential and a Positive Potential

In this power supply mode, in a not limited embodiment, the control circuit DRIV also comprises a control device DIGBT of an insulated gate bipolar transistor IGBT, a voltage inverter IN coupled to said control device DIGBT and a voltage level shift device DEN. This voltage level shift device DEN is coupled to the desaturation function DESAT.

In this third embodiment, the amplifier stage PSH-PLL is able to position the potential of the source S to the fixed potential VEE to switch on said field effect transistor JFET.

Also in this embodiment, the control device DIGBT comprises the amplifier stage PSH-PLL such as described previously.

In this example, the control device DIGBT of an insulated gate bipolar transistor IGBT is supplied between the negative potential VNEG and the positive potential VPOS.

It will be noted that in the case of a power supply between a negative potential VNEG and a positive potential VPOS, these potentials are chosen such that the positive potential VPOS is sufficient to switch off the JFET transistor, or such that the sum of the negative potential VNEG and of the positive potential VPOS in absolute value is sufficient to switch off the JFET transistor.

As illustrated in FIG. 8 and FIG. 9, the control circuit DRIV comprises a power supply that provides a power supply voltage VNEG-VPOS comprising a positive potential VPOS and a negative potential VNEG. The fixed potential VEE provided by the power supply of the control circuit DRIV at the gate G of the transistor JFET is positioned at the negative potential VNEG. The negative potential VNEG thus supplies the gate of the JFET transistor, that is to say Ug=VNEG.

It will be noted that the voltage inverter IN is also supplied by the same power supply voltage VNEG-VPOS as the control circuit DRIV.

According to a first mode of operation such as illustrated in FIG. 8, when the first switch T1 is open, and the second switch T2 is closed, one has the potential of Uo at the junction point P that is raised to the negative potential VNEG. Thus one obtains:
Uo=VEE=VNEG in input of the inverter IN, that is to say Us=VPOS in output of the inverter IN;
Vsg=Us−Ug=VPOS−VNEG, that is to say Vgs=VNEG−VPOS<0; and Vds=Ud−Us>0. The voltage. Vds departs from the range of power supply voltages [VPOS−VNEG].
The JFET transistor is in a switch off state.

According to a second mode of operation such as illustrated in FIG. 9, when the first switch T1 is closed and the second switch T2 is open, one has the potential Uo at the junction point P that is drawn to the ground. One thus obtains:
1) Without the voltage level shift device DEN.
Uo=VPOS in input from the inverter IN, that is to say Us=VNEG in output from the inverter IN;
Vsg=Us−Ug=VNEG−VNEG=0V; and
Vds=Ud−Us>0 and is thus referenced with relation to the negative potential VNEG since the potential Us of source S is positioned at the potential VNEG.
The voltage Vds belongs to the range of power supply voltages [VNEG-VPOS].

2) With the voltage level shift device DEN that enables the Vds voltage to be shifted from a voltage equal to VNEG voltage.
Vds=Ud−Us>0 and is thus referenced with relation to the ground.
Thus, the voltage Vds is within the voltage range [0V; VPOS].

In this mode of operation, the JFET transistor is in an on state.

In this on state, there are risks of short circuit on the JFET transistor, as described in the first embodiment (with a negative power supply).

In order to determine the presence of a short circuit, the DIGBT control device comprises, in a manner known to the person skilled in the art, the desaturation function DESAT. In a not limited example, this function is implemented by means of an internal voltage comparator (not represented), said comparator being able to compare the drain to source voltage Vds of said field effect transistor JFET with a reference voltage Vref. If the voltage Vds is greater than this voltage Vref, this means that the JFET transistor is in short circuit.

It will be noted that in the case of a standard control device DIGBT, when it is supplied with a negative potential VNEG and a positive potential VPOS, the emitter of the transistor IGBT that it controls is generally connected to ground and therefore the internal comparator that implements the desaturation function DESAT is supplied with a positive voltage 0V-VPOS to be able to measure the collector-emitter voltage Vice of said transistor IGBT in order to detect a short circuit.

Thus, in the case of controlling the JFET transistor by means of the control circuit DRIV that comprises a standard IGBT bipolar transistor control device DIGBT, the internal comparator is therefore referenced to the ground.

As the drain to source voltage Vds is referenced with relation to the ground that thus corresponds to the same reference voltage as that of the internal comparator, the comparison may be made without having an additional power supply.

Of course the description is not limited to the application, embodiments or examples described above.

Figure 11:
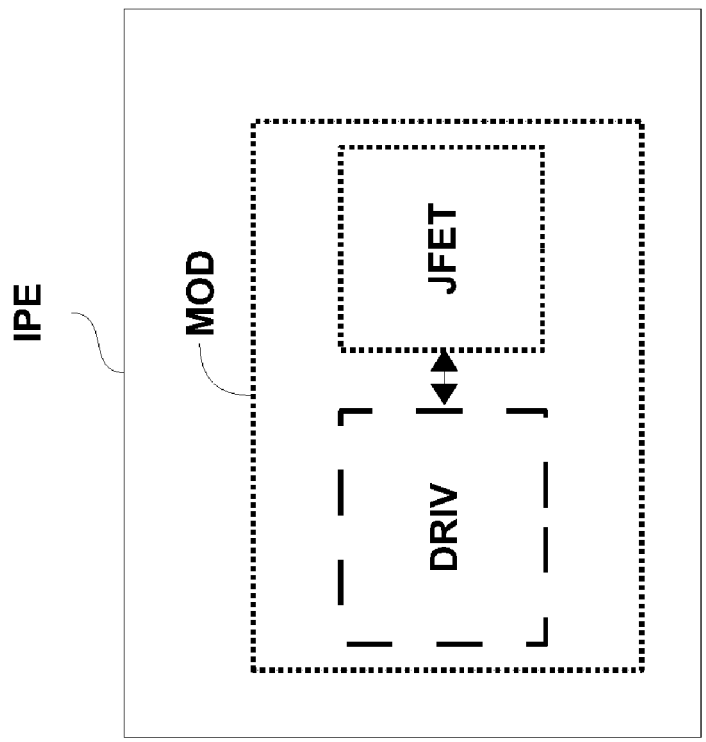
FIG. 11 schematically represents an electric thrust reverser comprising the electronic control module of FIG. 1.
Figure 10:
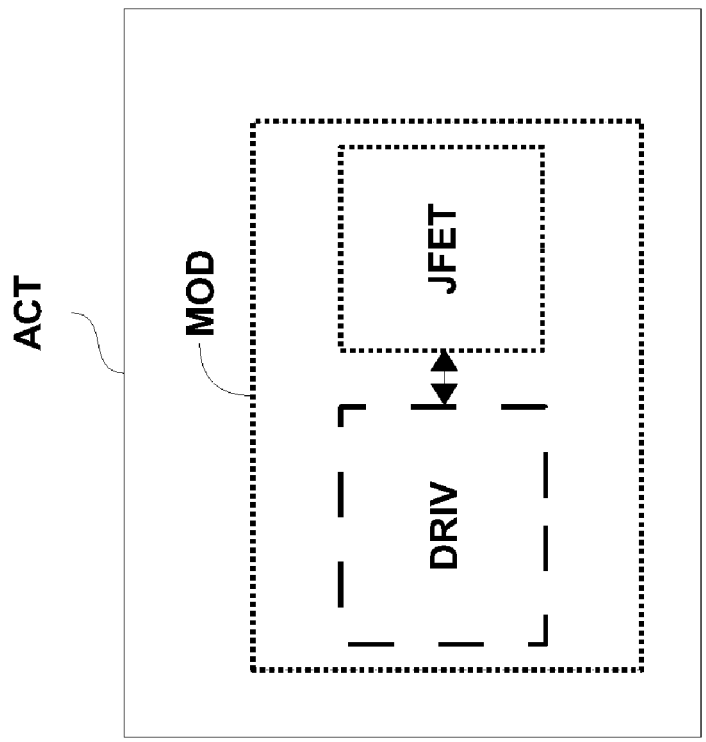
FIG. 10 schematically represents an electromechanical actuator comprising the electronic control module of FIG. 1.

Therefore, the electronic control module MOD may be utilized in any system making use of energy conversion. In this case, the electronic control module MOD is a power electronic converter. In not limited embodiments, an electromechanical actuator ACT may comprise such a power electronic converter as illustrated in FIG. 10, or an electric thrust reverser IPE may comprise such a power electronic converter as illustrated in FIG. 11, the electronic converter MOD being utilized to control the electromechanical actuator ACT or the electric thrust reverser IPE.

In not limited examples, an electromechanical actuator ACT is able to regulate the motor, control the brakes, or control the VSV "Variable Stator Valve" valves (commonly utilized in gas turbines, for example).

Thus, the electronic control module MOD may be utilized in particular but not exclusively in the aviation field, such electromechanical actuators and electric thrust reversers being commonly utilized in this field.

Thus, the control circuit DRIV of the electronic control module MOD may comprise any other transistor control device other than an IGBT bipolar transistor control device DIGBT, such as a MOSFET transistor control device.

In addition, the amplifier stage of the control circuit DRIV may be a "Push-Pull" stage composed of a MOSFET transistor instead of IGBT bipolar transistors.

The invention applies to any JFET transistor able to be controlled in negative voltage (Vgs=0V to switch it on, and Vgs<0V to switch it off), whatever its material of fabrication, such as in a not limited example, silicon, silicon carbide or gallium arsenide. Thus, in the not limited example of the JFET, the transistor is an N-channel JFET.

In addition, in a not limited embodiment, one may also have the fixed potential VEE positioned at an intermediate potential between the highest potential and the lowest potential provided by the power supply of the control circuit DRIV. The potential Ug of the gate G of the transistor is thus fixed at this intermediate potential, and the JFET transistor is controlled to switch it on with the lowest potential and switch it off with the highest potential. In this case, the lowest potential VNEG is chosen to be slightly higher than the intermediate potential, in a not limited example equal to 1V, and the highest potential VPOS is chosen to be significantly higher than the intermediate potential, in a not limited example equal to +25V. In a not limited example, the intermediate potential is taken to be equal to 0V.

It will be noted that this mode makes the JFET transistor more conductive.

Finally, of course, the electronic control module MOD may comprise a short circuit protection device for the control circuit DRIV, a protection device that is able to be activated following detection of a short circuit as described previously. Thus, this enables the duration of energy dissipation due to a short circuit to be limited, thereby preventing destruction of the control circuit DRIV. As such short circuit protection is known to the person skilled in the art, it is not described here.

Thus, the invention described presents in particular the following advantages:

The invention is simple to implement;

With the control of the source S of the JFET transistor compared to gate G, operation in off or on state mode of a JFET transistor is not changed compared to a command from the prior art of the gate G of said JFET transistor: when Vgs=0 the JFET transistor is on, and when Vgs<0 the JFET transistor is off;

The invention prevents having an additional power supply (insulated) for the short circuit detection function: therefore the design of the electronic control module has been simplified. There is no additional winding (for example in the case of switching power supply by transformer) or additional associated regulation, no matter whether outside the control circuit or inside (the design of the control circuit thus being simplified);

The invention enables a standard control device to be utilized to control the IGBT bipolar transistors or to control MOSFET transistors and therefore enables control devices that are widely spread on, the market to be used:

The invention therefore enables the utilization of a bipolar transistor to be easily replaced by a JFET transistor that presents additional advantages compared to bipolar transistors, such as utilization at high temperatures, for example 200°. For this purpose, few adaptations are necessary since all that is necessary is an inverter (and if necessary a voltage level shift device) has to be added and suitable connections have to be carried out on the source and the gate of the JFET transistor; and The invention thus enables a short circuit detection function that is commonly integrated in control devices of an IGBT transistor or of a MOSFET transistor to be utilized; and The invention enables a solution to control a JFET transistor that is alternative from the prior art to be proposed.

The invention claimed is:

1. An electronic control module for a field effect transistor comprising a gate, a drain and a source, the module comprising:
a control circuit comprising:
a power supply that is configured to provide a fixed potential to the gate of the field effect transistor;
an amplifier stage that is configured to vary the potential of the source of the field effect transistor with relation to the potential of the gate of said field effect transistor; and
a comparator configured to compare a drain to source voltage of the field effect transistor with a reference voltage, and
the electronic control module comprising the field effect transistor whose:
gate is connected to said fixed potential; and
source is connected to said amplifier stage.

2. The electronic control module according to claim 1, wherein the fixed potential is the lowest potential provided by the power supply.

3. The electronic control module according to claim 1, wherein the amplifier stage is configured to position the potential of the source to the fixed potential to switch on said field effect transistor.

4. The electronic control module according to claim 1, wherein the fixed potential is a negative potential.

5. An electronic control module for a field effect transistor comprising a gate, a drain and a source, the module comprising:
a control circuit comprising:
a power supply that is configured to provide a fixed potential to the gate of the field effect transistor; and
an amplifier stage that is configured to vary the potential of the source of the field effect transistor with relation to the potential of the gate of said field effect transistor; and
the electronic control module comprising the field effect transistor whose:
gate is connected to said fixed potential; and
source is connected to said amplifier stage,
wherein the amplifier stage comprises at least two transistors placed in series in a push-pull type assembly, one of the transistors of said amplifier stage comprising a collector that is configured to be connected with the gate of said field effect transistor.

6. An electronic control module for a field effect transistor comprising a gate, a drain and a source, the module comprising:
a control circuit comprising:
a power supply that is configured to provide a fixed potential to the gate of the field effect transistor;
an amplifier stage that is configured to vary the potential of the source of the field effect transistor with relation to the potential of the gate of said field effect transistor; and
a control device of an insulated gate bipolar transistor and a voltage inverter coupled to said control device, said voltage inverter being connected in input to a common junction point of the amplifier stage and in output to the source of said field effect transistor; and
the electronic control module comprising the field effect transistor whose:
gate is connected to said fixed potential; and
source is connected to said amplifier stage.

7. The electronic control module according to claim 6, wherein the control circuit further comprises a voltage level shift device.

8. An electromechanical actuator that comprises an electronic control module for a field effect transistor comprising a gate, a drain and a source, the module comprising:
   a control circuit comprising:
   a power supply that is configured to provide a fixed potential to the gate of the field effect transistor; and
   an amplifier stage that is configured to vary the potential of the source of the field effect transistor with relation to the potential of the gate of said field effect transistor; and
   the electronic control module comprising the field effect transistor whose:
   gate is connected to said fixed potential; and
   source is connected to said amplifier stage.

9. An electric thrust reverser that comprises an electronic control module for a field effect transistor comprising a gate, a drain and a source, the module comprising:
   a control circuit comprising:
   a power supply that is configured to provide a fixed potential to the gate of the field effect transistor; and
   an amplifier stage that is configured to vary the potential of the source of the field effect transistor with relation to the potential of the gate of said field effect transistor; and
   the electronic control module comprising the field effect transistor whose:
   gate is connected to said fixed potential; and
   source is connected to said amplifier stage.

* * * * *